United States Patent
Dutta et al.

(10) Patent No.: US 6,420,904 B1
(45) Date of Patent: Jul. 16, 2002

(54) DOMINO LOGIC WITH SELF-TIMED PRECHARGE

(75) Inventors: Santanu Dutta, Sunnyvale; Deepak Singh, Santa Clara, both of CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/769,075

(22) Filed: Jan. 25, 2001

(51) Int. Cl.$^7$ ............................................. H03L 19/096
(52) U.S. Cl. .............................. 326/93; 326/98; 326/121
(58) Field of Search ................................. 326/93, 95–98, 326/112, 119, 121

(56) References Cited

U.S. PATENT DOCUMENTS

| | | | |
|---|---|---|---|
| 5,671,151 A | * | 9/1997 | Williams ..................... 364/489 |
| 6,040,716 A | * | 3/2000 | Bosshart ...................... 326/98 |
| 6,239,612 B1 | * | 5/2001 | Milshtein et al. ............. 326/95 |

FOREIGN PATENT DOCUMENTS

US WO-98/29949 * 7/1998 .................. 326/93

* cited by examiner

*Primary Examiner*—Don Phu Le
(74) *Attorney, Agent, or Firm*—Harold Tsiang

(57) ABSTRACT

The precharge of a domino logic stage is controlled based on the precharge delay of a prior domino logic stage. The precharge of the logic stage does not occur until the output of the prior logic stage corresponds to the precharge logic state. Because the precharge logic state output of a preceding stage is an inactive state of a subsequent logic stage, the logic function of the subsequent logic stage is in a non-conducting state when the output of the prior logic stage is in the precharge logic state. By providing the precharge to a subsequent stage-only after the output of the prior stage is in the precharge state, there can be no DC current flow during the precharge of the subsequent stage, and the need for an evaluation transistor to block the DC current flow during precharge is eliminated. The elimination of the evaluation transistor eliminates the delay introduced by the evaluation transistor in a precharge logic stage, reduces the circuit area for the logic stage, reduces the load on the clock circuit, and reduces the power consumption of each logic stage.

10 Claims, 2 Drawing Sheets

DOMINO LOGIC WITH SELF-TIMED PRECHARGE

BACKGROUND OF THE INVENTION

1. Field of the Invention

This invention relates to the field of electronic circuit design, and in particular to the design of logic circuits for use in a domino-chain of logic devices.

2. Description of Related Art

The use of domino logic is well known in the art. As the name implies, a domino logic circuit propagates logic values from one stage to the next; a first stage propagates a logic result to a second stage, which propagates the result to a third stage, and so on. Typically, a clock signal is used to preset all of the stages during a first phase of the clock, and to enable the stages to change state in a second phase of the clock, depending upon the input signals and logic function of each stage. Each stage is configured to provide an inactive state when it is precharged, such that this stage can have no effect on the next stage while it is in the inactive state. The state remains inactive until the stage is enabled and the application of the input to the gate's logic function results in a change of state to an active state; only then will the next stage potentially change state, depending upon the application of this active state to the next stage's logic function.

FIG. 1 illustrates an example domino CMOS circuit 100 comprising a series of domino stages 110a–c. In this example, each stage includes a P-channel transistor 120p and an N-channel transistor 120n in series with its logic function 130a–c, each transistor 120p, 120n being gated by a common clock, or precharge, signal 141, such that only one of the transistors is conducting at any time, thereby precluding the flow of DC current, for low power consumption. Both transistors 120p and 120n are required, to prevent the flow of DC current when the precharge transistor 120p conducts and the logic function 130 also conducts.

The logic function 130 may be any combination of transistors, but generally includes transistors of one type, either p-channel or n-channel. Because n-channel devices are generally faster than p-channel devices of equal size, the logic function 130 in high-speed designs generally include only n-channel devices. Logic function 130b is illustrated as a two-input OR gate, implemented as a NOR combination of n-channel devices 131, 132, and an inverter 135. In this example, the clock is structured to precharge the logic function 130 via the p-channel device when it is at a logic-0 level, and to 'evaluate' the logic function when it is at the logic-1 level.

In this n-channel logic example, when the clock is in the precharge state (logic-0), the transistors 120p conduct, and the output of each logic function 130 provides a logic-0 output, via, for example, a corresponding inverter 135 in each logic function 130. Because the logic function 130 includes only n-channel devices, the logic-0 output from one stage cannot alter the logic state of a subsequent stage. To avoid noise-induced transients, a weak-latch (not shown) is often used to hold the output at a logic-0 state until it is actively driven to a logic-1 state by a discharge through the n-channel devices.

When the clock transitions to the evaluate state (logic-1), the p-channel transistors 120p cease conduction, and the n-channel devices 120n conduct, allowing the logic function 130 to change from the precharge state, as determined by its input state. Note that, in an n-channel logic function 130, a transition to the active, non-precharge, state cannot occur unless an input transitions to a logic-1 state. That is, changes in state propagate sequentially through the stages 110a–110b–110c, in a falling-domino-like manner.

As would be evident to one of ordinary skill in the art, if a logic function 130 includes only p-channel devices, the n-channel transistor 120n would be used to provide a 'precharge' to logic-0, and the preceding stage would be configured to provide a logic-1 state as the precharge state. Alternating n-channel and p-channel stages may be employed to eliminate the need for the inverter 135 in each logic function 130. Other configurations, including p-channel and n-channel devices within a logic function 130 (with appropriate precharge states on each input) are also feasible.

The speed of a domino stage is determined by the delay of the logic function, plus the delay through the evaluation transistor, 120p or 120n. Generally, the logic functions 130 in a typical design, such as an adder or multiplier, include only two or three inputs, and thereby a maximum stack size of two or three transistors in series. Assuming equally sized transistors, the evaluation transistor 120 can amount to a third or a quarter of the propagation delay of each stage. A large size evaluation transistor will reduce the delay through the transistor, but at the cost of circuit area, and increased loading on the clock circuit (and thereby increased switching power consumption).

BRIEF SUMMARY OF THE INVENTION

It is an object of this invention to eliminate the delay caused by the use of an evaluation transistor in a pre-charged logic stage. It is a further object of this invention to reduce the circuit area required in a pre-charged logic stage. It is a further object of this invention to reduce the load of a clock circuit in a pre-charged logic design. It is a further object of this invention to reduce the power consumption of a pre-charged logic design.

These objects and others are achieved by controlling the precharge of a logic stage based on the precharge delay of a prior logic stage. The precharge of the logic stage does not occur until the output of the prior logic stage corresponds to the precharge logic state. Because the precharge logic state output of a preceding stage is an inactive state of a subsequent logic stage, the logic function of the subsequent logic stage is in a non-conducting state when the output of the prior logic stage is in the precharge logic state. By providing the precharge to a subsequent stage only after the output of the prior stage is in the precharge state, there can be no DC current flow during the precharge of the subsequent stage, and the need for an evaluation transistor to block the DC current flow during precharge is eliminated. The elimination of the evaluation transistor eliminates the delay introduced by the evaluation transistor in a precharge logic age, reduces the circuit area for the logic stage, reduces the load on the clock circuit, and reduces the power consumption of each logic stage.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE INVENTION

For ease of reference and understanding, this invention is presented herein using the paradigm of domino stages having p-channel precharge and n-channel discharge structures. As noted above, alternative structures, including combinations of p-channel and n-channel precharge structures, and corresponding n-channel and p-channel discharge structures, may also be used. As will be evident to one of ordinary skill in the art, the principles of this invention are applicable to any logic stages that conventionally use a combination of precharge devices and evaluation devices to avoid a DC current path from power to ground during the precharge phase of each precharge-evaluate cycle.

Figure 2:
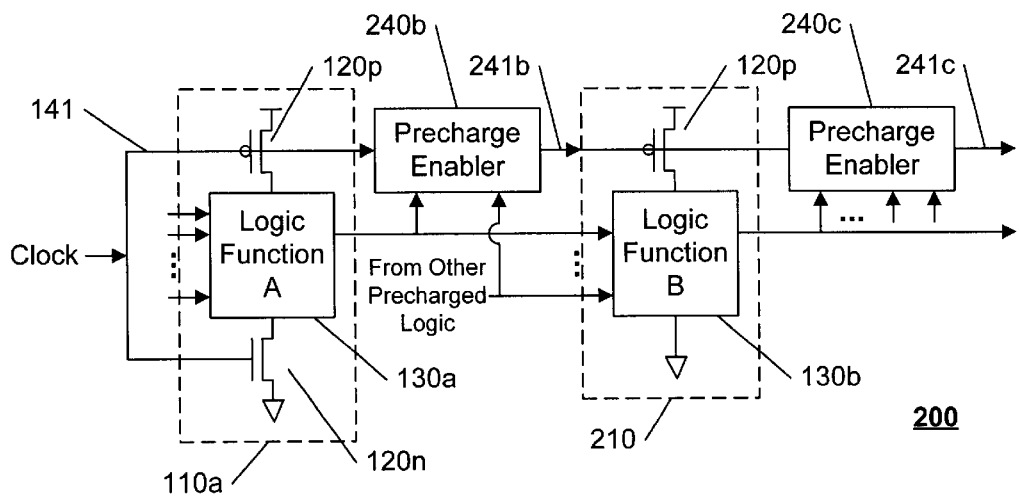
FIG. 2 illustrates an example circuit comprising a modified domino logic stage in accordance with this invention.

FIG. 2 illustrates a logic network 200 that includes a modified domino logic stage 210 in accordance with this invention. As illustrated the logic stage 210 includes the conventional precharge device 120p, but does not include the conventional evaluation device 120n that is illustrated in the first stage 110a. As noted above, the evaluation device 120n is used in a conventional precharge logic stage 110a to assure that a DC current path between power and ground cannot occur when the precharge device 120p conducts.

Figure 1:
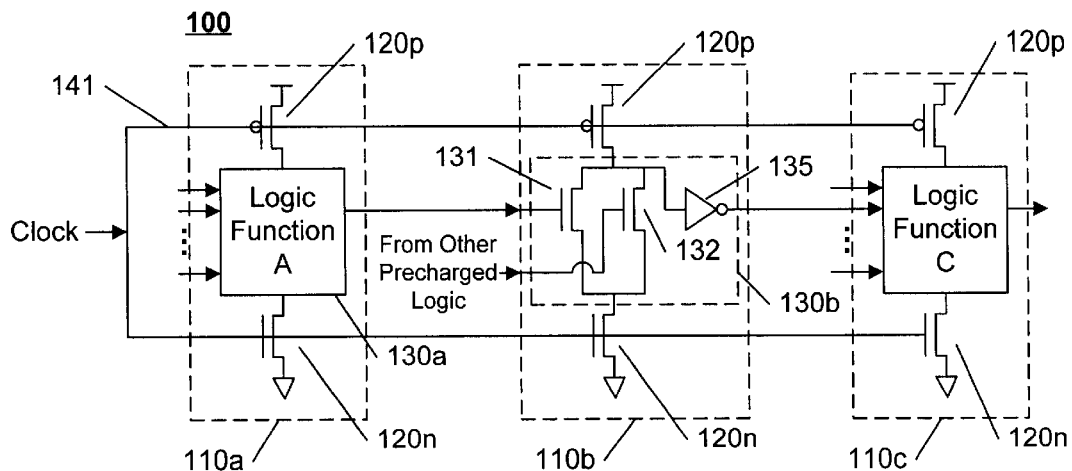
FIG. 1 illustrates an example circuit comprising domino logic stages, as is known in the art.

In accordance with this invention, the DC current path between power and ground is prevented by assuring that the precharge device 120p does not conduct until the logic function 130 is placed into a non-conducting state. As discussed above, in a conventional domino logic stage 110a, the inactive state of an output is configured to place the devices in the logic function block 130 of a subsequent logic stage 110b into a non-conducting state, so that the precharged state of the subsequent stage 110b is retained until it is actively discharged via the logic function 130b and the evaluation device (120n in FIG. 1), after the discharge device 120p is placed in a non-conducting state.

This invention is based on the observation that when the inputs to a domino logic block are placed in the inactive state, current cannot flow through the logic function 130. Therefore, by delaying the application of the precharge signal until the inputs are in the inactive state, a DC current path from power to ground can be avoided, without the use of an evaluation device 120n that also assures that a DC current path from power to ground does not occur when the stage 110 is being precharged.

As illustrated in FIG. 2, a precharge enabler 240 is configured to apply the precharge signal 241b to the precharge device 120p of logic stage 210. The precharge enabler 240 receives the inputs to the logic stage 210, and the original precharge signal 141, and provides the precharge signal 241b only when each of the inputs to the logic function 130b is in the inactive state. That is, in the n-channel logic function example, wherein the inactive state for an n-channel device is a logic-0, the precharge enabler 240b does not assert the precharge signal 241b until each of the inputs to the logic function 130b is at the logic-0 state, and the precharge signal 141 is also asserted. Because each of the inputs to the logic function 130b is in the inactive state, and therefore the logic function 130b is in a non-conducting state, DC current cannot flow between power and ground when the precharge signal 241 is applied.

In like manner, a precharge enabler 240c is provided to delay the assertion of a precharge signal 241c until all of the inputs to a subsequent stage are in the inactive state, and so on. The precharge enabler 240c may be configured to delay either the original precharge signal 141 or the delayed precharge signal 241b, because the delayed precharge signal 241c need not be asserted until after the assertion of the delayed precharge signal 241b, and a cascaded structure as illustrated in FIG. 2 reduces the load on the original precharge signal 141.

Figure 3:
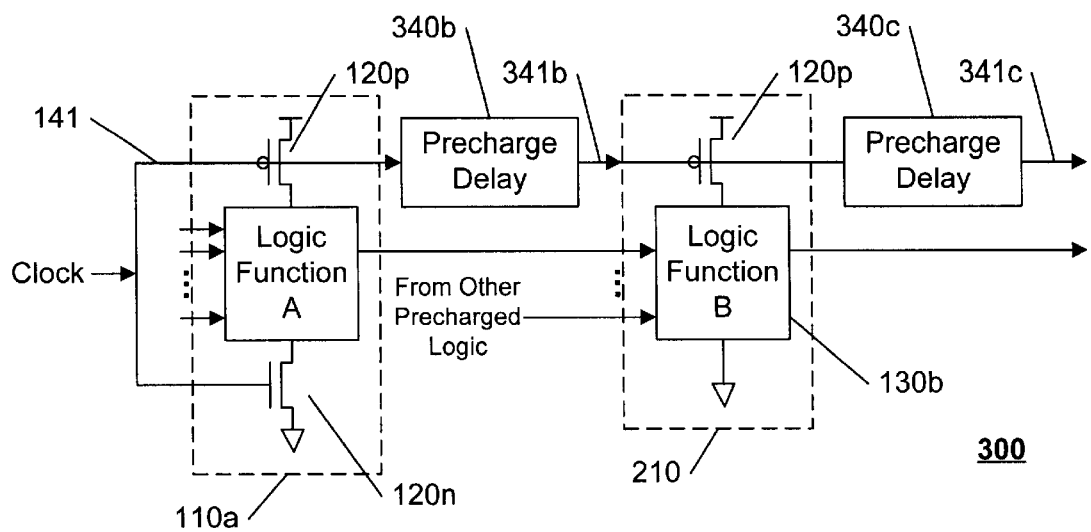
FIG. 3 illustrates an example circuit comprising an alternative precharge enabling structure for controlling the precharge of a modified domino logic stage in accordance with this invention.

Because the example precharge enabler 240b receives the inputs to the subsequent logic stage 210, the precharge enabler 240b adds an additional load to each of the inputs, thereby decreasing the speed of transition of the inputs, and increasing the power consumption. FIG. 3 illustrates an alternative embodiment of a logic network 300 that allows the use of a logic stage 210 that does not include an evaluation device, and does not add an additional load to the logic signals. As noted above, the purpose of the precharge enabler 240b of FIG. 2 is to delay the assertion of the precharge signal to the logic stage 210 until each of the inputs to the logic stage 210 is in the inactive state. If the maximum time delay, after the assertion of the precharge signal 141, for the output of a logic stage 110a to achieve the inactive state is known, then the delay in the assertion of the precharge signal 241b to the subsequent stage can be delayed by this maximum amount, thereby avoiding the need to monitor the input signals to the subsequent stage 210 to determine when they achieve the inactive state. As illustrated in FIG. 3, a precharge delay 340b is used to provide this fixed-delay assertion of the precharge signal 341b to the logic stage 210. Because the outputs of the prior stages will be in the inactive state after this fixed-delay, the logic function 130b will be in the non-conductive state, and the assertion of the delated precharge signal 341b will not result in a DC current path from power to ground.

In like manner, a precharge delay 340c is used to provide a delayed precharge signal 341c for a subsequent stage, wherein the fixed-delay of this delayed precharge signal 341c is based on the maximum delay time for placing the outputs of the prior stages into an inactive state. The precharge signal to subsequent stages will be similarly delayed, based on the delay associated with placing the outputs of the prior stages into an inactive state.

Note that the input to the logic stage 210 includes an input from other precharge logic blocks (not shown). These logic blocks are effectively operated in parallel with the logic stage 110a. The precharge delay block 340b is configured to delay the assertion of the precharge signal 341b to the precharge device 120p of the logic stage 210 based on the maximum precharge-delay of each of the logic blocks that provide an input to the logic stage 210. In like manner, other precharge logic blocks typically operate in parallel to the logic stage 210 to provide inputs to a subsequent stage (not shown). The precharge delay block 340c is configured to delay the assertion of the precharge signal 341c based on the maximum precharge-delay of the blocks that provide inputs to the subsequent stage. As such, the fixed delay of each of the precharge delay blocks 340b, 340c may differ.

In a conventional domino logic structure, the total duration of the evaluation period is determined based on the maximum delay to bring an output of the last stage of the logic structure to an active state, based on an active state of an input to the first stage of the logic structure, measured from the time of assertion of the evaluation signal (or, de-assertion of the precharge signal). This total duration will include, in a conventional domino logic structure, the additional delay associated with each evaluation device of each stage. In accordance with this invention, however, the evaluation device is only used in the first stage, and therefore, the total duration of the evaluation period is substantially reduced. In an N-stage domino logic structure, a reduction of (N−1)*(the delay of the evaluation device) can, ideally, be achieved via the application of the principles of this invention.

Figure 4:
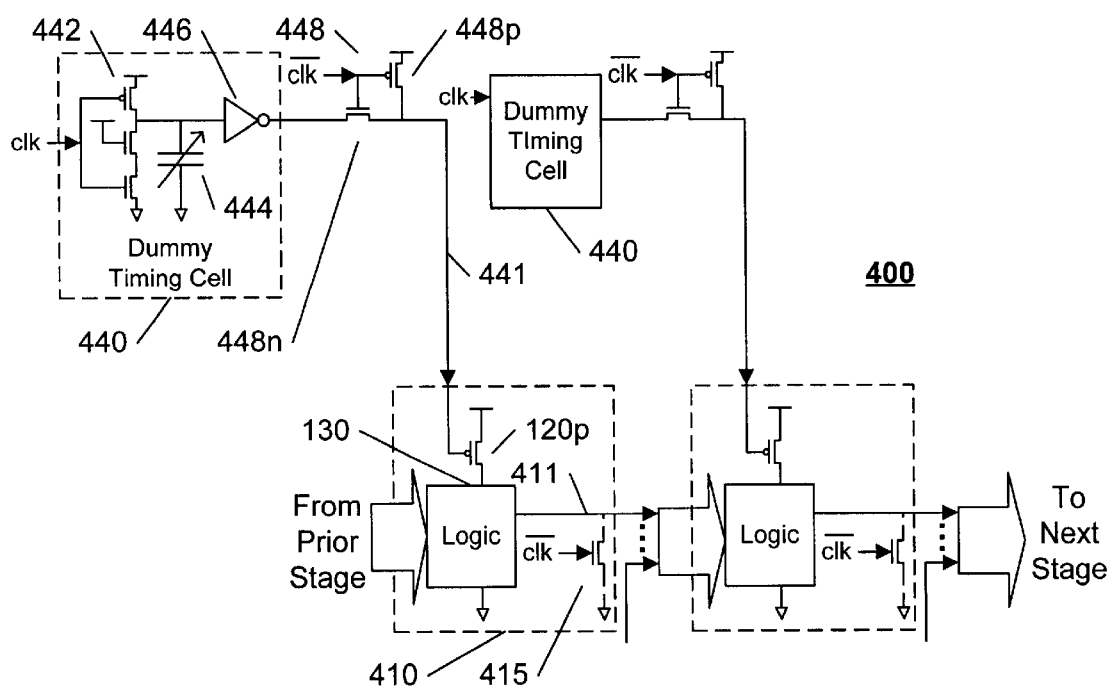
FIG. 4 illustrates a preferred embodiment of a domino logic structure in accordance with this invention.

FIG. 4 illustrates a preferred embodiment of this invention. In this embodiment, the precharge delay is provided by a dummy timing cell 440, and precharge enabling logic 448. The dummy timing cell 440 includes a logic structure 442 that is similar in structure to the logic blocks 130 in the logic stages 410. By using a similar logic structure, the timing characteristics of the logic function 130 that vary with environmental conditions, or fabrication conditions, will be reflected in the timing cell 440, to provide a delay that varies with the variations of the delay of the logic function 130. The actual delay of the timing cell 440 is preset to correspond to the maximum delay associated with the precharge propagation delay in a prior logic stage, as noted above. This preset delay may be embodied by any of a variety of techniques, common in the art, and symbolically illustrated in FIG. 4 as an adjustable load capacitance on the logic structure 442.

When the original precharge signal 141 is in the logic-1 state, the capacitor 444 is discharged, and the inverter 446 provides a logic-1 output. At the same time, an inversion 141' of the precharge signal 141 is in the logic-0 state, and the precharge signal 441 is a logic-1, and places the precharge device 120p into a non-conductive state.

When the original precharge signal 141 transitions to a logic-0 state, to assert precharge, the complementary precharge signal 141' transitions to a logic-1 state, and places the enabling device 448n into a conducting state. The asserted precharge signal 141 places the precharge device 442p into a conducting state, and begins to charge the capacitor 444. When the voltage on the capacitor 444 rises above the switching threshold of the inverter 446, the inverter 446 asserts a logic-0 as the precharge signal 441 to precharge device 120p in the logic stage 410. The capacitor 444 is sized so that the delay of the transition of the precharge signal 141 to the assertion of the precharge signal 441 is sufficient long to assure that all of the logic signals from the prior stage have reached the inactive state, as discussed above.

When the original precharge signal 141 transitions to a logic-1 state, to de-assert precharge, the enabling device 448n enters the non-conductive state, and the capacitor 444 is discharged through the series of n-channel devices in the logic structure 442. The enabling device 448p brings the delayed precharge signal 441 to a de-asserted, logic-1 state. The transition of the original precharge signal 141 corresponds to a transition into the evaluation phase, and the first stage (110a of FIG. 3) of the logic structure begins the domino-propagation of the logic values produced in response to the first stage input signals.

FIG. 4 also illustrates an optional device 415 that is used to bring the output of the logic stage 410 to an inactive state as soon as the domino logic structure enters the precharge phase. This eliminates the delay of the precharge from the precharge input 441 to the logic output 411.

By providing this reduced-delay inactive output, the timing cells 440 can be configured to correspond to this reduced delay, thereby providing an optimization of the precharge phase. The duration of the precharge phase is configured to assure that the output of all the logic functions 130 do, in fact, enter the inactive state before the corresponding precharge signal is de-asserted, to assure that the logic output 441 does not return to the active state when the device 415 is placed in the non-conductive state.

As noted above, the device 415 is optional, because although it decreases the required precharge duration, it increases the power consumption, because the output of the logic function 130 may be actively driven high (via the inverter 135 of FIG. 1, for example), and the enabling of the device 415 will produce a DC path to ground. Assuming that each stage in the logic structure is configured with a corresponding device 415, however, the duration of this DC current flow is merely the transition time of the logic function output device (135 of FIG. 1).

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

We claim:
1. A logic structure comprising:
   a plurality of logic stages,
      each logic stage being configured to provide, on at least one output,
         a corresponding precharge state during a precharge phase, and
         a logic output state, based on one or more logic inputs, during an evaluation phase that is different from the precharge phase, and
   at least one precharge control device,
   wherein
   at least one of the logic stages is configured to include
      a precharge device that provides the precharge state, and
      a logic block that provides the logic output state, and
      the precharge device and the logic block form a direct series connection between a power source and a ground potential, and
   the precharge control device is configured to enable the precharge device to provide the precharge state only when the logic inputs are in an inactive state that places the logic block in a non-conductive state;
   wherein the precharge control device monitors the logic inputs to determine when the logic inputs are in the inactive state.

2. The logic structure of claim 1, wherein
   the precharge control device is configured to provide the precharge state after a predefined delay that is based on a delay associated with transitioning the logic inputs into the inactive state.

3. A logic structure comprising:
   a plurality of logic stages,
      each logic stage being configured to provide, on at least one output,
         a corresponding precharge state during a precharge phase, and
         a logic output state, based on one or more logic inputs, during an evaluation phase that is different from the precharge phase, and
   at least one precharge control device,
   wherein
   at least one of the logic stages is configured to include a
      precharge device that provides the precharge state, and
      a logic block that provides the logic output state, and
      the precharge device and the logic block form a direct series connection between a power source and a ground potential, and the precharge control device is configured to enable the precharge device to provide the precharge state only when the logic inputs are in an inactive state that places the logic block in a non-conductive state;

wherein at least one other logic stage is configured to include
an other precharge device that provides the precharge state of the at least one other logic stage,
an evaluation device, and
an other logic block that provides the logic output of the at least one other logic stage, and
the other precharge device, the evaluation device, and the other logic block form a direct series connection between a power source and a ground potential, and the evaluation device is configured to be enabled for conducting current only when the other precharge device is not providing the precharge state of the at least one other logic stage.

4. The logic structure of claim 3 wherein the at least one output of the other logic block corresponds to an input of the logic inputs of the logic block, and the precharge control device is configured to provide the precharge state after a predefined delay that is based on a delay associated with transitioning the at least one output of the other logic block into the inactive state.

5. A logic structure comprising:

a plurality of logic stages,
each logic stage being configured to provide, on at least one output,
a corresponding precharge state during a precharge phase, and
a logic output state, based on one or more logic inputs, during an evaluation phase that is different from the precharge phase, and
at least one precharge control device, wherein at least one of the logic stages is configured to include
a precharge device that provides the precharge state, and
a logic block that provides the logic output state, and
the precharge device and the logic block form a direct series connection between a power source and a ground potential, and the precharge control device is configured to enable the precharge device to provide the precharge state only when the logic inputs are in an inactive state that places the logic block in a non-conductive state.

wherein the precharge control device includes:

6. The logic structure of claim 5, wherein the precharge control device further includes
a precharge enabling device that propagates the delayed precharge signal to the precharge device during the precharge phase.

7. A domino logic structure comprising:

a first logic stage that includes:
a first precharge device that is configured to place an output of the first logic stage into a first precharge state, and
a first logic element and a first evaluation device that are configured to place the output into a logic state that is dependent upon first inputs to the first logic stage, and wherein the first precharge device, the first logic element, and the first evaluation device provide a series current path from a power source to a ground potential, and the first evaluation device is configured to be non-conductive when the first precharge device is conductive, thereby preventing current flow from the power source to the ground potential when the first precharge device is conductive, and a second logic stage, operably coupled to the first logic stage, that includes:
a second precharge device that is configured to place an output of the second logic stage into a second precharge state,
a second logic element that is configured to place the output into a logic state that is dependent upon second inputs to the second logic stage, the output of the first logic stage being one of the second inputs, and
a precharge control device that is configured to control the second precharge device, wherein the second precharge device, and the second logic element provide a direct series current path from a power source to a ground potential, and
the precharge control device is configured to enable the second precharge device to provide the precharge state only when the output of the first logic state is in the precharge state;

a third logic stage, operably coupled to the second logic stage, that includes:
third precharge device that is configured to place an output of the third logic stage into a third precharge state,
a third logic element that is configured to place the output into a logic state that is dependent upon third inputs to the third logic stage, the output of the second logic stage being one of the third inputs, and
an other precharge control device that is configured to control the third precharge device, wherein the third precharge device, and the third logic element provide a direct series current path from a power source to a ground potential, and
the other precharge control device is configured to enable the third precharge device to provide the precharge state only when the output of the second logic state is in the precharge state.

8. The domino logic structure of claim 7, wherein:

the second precharge device includes a p-channel device, having a gate that is coupled to the precharge control device, and a channel that provides a current path between the power source and the second logic element, the second logic element includes at least one n-channel device, having a gate that is coupled to the output of the first logic stage, and a channel that provides at least a part of a current path between the second precharge device and the ground potential, and the first precharge state corresponds to a logic-0 state, such that when the output of the first logic stage is in the precharge state, the at least one n-channel device is in a non-conductive stat.

9. The domino logic structure of claim 7, wherein the precharge control device is configured to enable the second precharge device after a predetermined delay after the first precharge device is enabled to place the output of the first logic stage into the first precharge state.

10. The domino logic structure of claim 9, wherein the predetermined delay is based upon a delay that is associated with placing the output of the first logic stage into the first precharge state.

* * * * *